(12) United States Patent
Amada

(10) Patent No.: US 9,941,832 B2
(45) Date of Patent: Apr. 10, 2018

(54) SEMICONDUCTOR DEVICE

(71) Applicant: Renesas Electronics Corporation, Tokyo (JP)

(72) Inventor: Kenji Amada, Tokyo (JP)

(73) Assignee: Renesas Electronics Corporation, Koutou-ku, Tokyo (JP)

(*) Notice: Subject to any disclaimer, the term of this patent is extended or adjusted under 35 U.S.C. 154(b) by 0 days.

(21) Appl. No.: 15/380,148

(22) Filed: Dec. 15, 2016

(65) Prior Publication Data
US 2017/0099024 A1  Apr. 6, 2017

Related U.S. Application Data

(63) Continuation of application No. 14/543,220, filed on Nov. 17, 2014, now Pat. No. 9,559,629, which is a continuation of application No. 14/057,213, filed on Oct. 18, 2013, now Pat. No. 8,917,134.

(30) Foreign Application Priority Data

Nov. 1, 2012 (JP) ................................ 2012-242183

(51) Int. Cl.
H02M 7/5387 (2007.01)
H02P 27/06 (2006.01)
H01L 27/092 (2006.01)
B60L 3/00 (2006.01)

(52) U.S. Cl.
CPC ................ *H02P 27/06* (2013.01); *B60L 3/00* (2013.01); *H01L 27/092* (2013.01)

(58) Field of Classification Search
CPC ....... H02P 27/06; H02M 7/5387; H02M 1/32; H01L 27/092
See application file for complete search history.

(56) References Cited

U.S. PATENT DOCUMENTS

| | | | |
|---|---|---|---|
| 4,937,467 A | 6/1990 | Tuska et al. | |
| 5,469,095 A | 11/1995 | Peppiette et al. | |
| 5,796,276 A | 8/1998 | Philips et al. | |
| 5,892,268 A | 4/1999 | Yashita et al. | |
| 6,690,212 B2 | 2/2004 | Yamamoto | |
| 6,847,237 B2 | 1/2005 | Kernhof et al. | |
| 7,692,285 B2 | 4/2010 | Sato et al. | |
| 7,772,725 B2 | 8/2010 | Siman-Tov | |
| 7,902,884 B2 | 3/2011 | Kanai et al. | |
| 8,917,134 B2 | 12/2014 | Amada | |
| 9,077,259 B2 | 7/2015 | Shi | |
| 9,559,629 B2 * | 1/2017 | Amada | ................... H02P 27/06 |

FOREIGN PATENT DOCUMENTS

JP      2007-012857 A      1/2007

* cited by examiner

*Primary Examiner* — Kenneth B Wells
(74) *Attorney, Agent, or Firm* — Sughrue Mion, PLLC

(57) ABSTRACT

A semiconductor device includes an H-Bridge driver. The H-Bridge driver includes a first island on which a first power transistor and a second power transistor are mounted; a second island on which a third power transistor and a fourth power transistor are mounted; a third island on which a control circuit and a protection power transistor are mounted, the control circuit being configured to control the first, second, third and fourth power transistors, wherein the third island is allocated between the first island and the second island.

3 Claims, 6 Drawing Sheets

SEMICONDUCTOR DEVICE

CROSS-REFERENCE TO RELATED APPLICATIONS

This application is a Continuation of U.S. application Ser. No. 14/543,220, filed Nov. 17, 2014, and issued as U.S. Pat. No. 9,559,629 which is a Continuation of U.S. application Ser. No. 14/057,213 filed Oct. 18, 2013 and issued as U.S. Pat. No. 8,917,134, which claims priority from Japanese Patent Application No. 2012-242183 filed on Nov. 1, 2012, the disclosures of which are incorporated herein by reference in their entirety.

BACKGROUND

The present invention relates to a semiconductor device to control the forward or reverse rotation of electrical equipment such as a motor.

A motor capable of forward rotation and reverse rotation is used in order to operate a power window or a door lock of an automobile for example. A mechanical switch (relay switch) is generally used for controlling the forward or reverse rotation of a motor. In recent years however, a forward reverse control circuit using a semiconductor device has been used increasingly.

FIG. 1 shows an example of an H-bridge circuit for materializing forward reverse control with a semiconductor device. A first arm is formed by coupling a drain of a MOS transistor 104 that is a P-channel MOS transistor of a high side to a drain of a MOS transistor 106 that is an N-channel MOS transistor of a low side. Meanwhile, a second arm is formed by coupling a drain of a MOS transistor 105 that is a P-channel MOS transistor of a high side to a drain of a MOS transistor 107 that is an N-channel MOS transistor of a low side. An H-bridge in which the first arm and the second arm are parallelly-coupled is formed by coupling sources of the high side MOS transistors 104 and 105 to a supply terminal 103 and coupling sources of the low side MOS transistors 106 and 107 to an earth terminal 102. A pair of terminals for driving a motor 108 is formed at a middle point node of the first arm and a middle point node of the second arm.

When the motor 108 rotates forward, a control circuit turns on the MOS transistors 104 and 107 and turns off the MOS transistors 105 and 106. As a result, electric current flows through the MOS transistor 104, the motor 108, the MOS transistor 107, and then the earth terminal 102 in sequence and the motor rotates forward. When the motor rotates reversely, the control circuit turns on the MOS transistors 105 and 106 and turns off the MOS transistors 104 and 107. As a result, electric current flows through the MOS transistor 105, the motor 108, the MOS transistor 106, and then the earth terminal 102 in sequence. On this occasion, the electric current flows in the motor 108 in a direction opposite to the direction of the flow in the event of forward rotation and hence the motor 108 rotates reversely.

An example of a semiconductor device for driving a motor is described in Japanese Unexamined Patent Application Publication No. 2007-12857.

SUMMARY

When the forward or reverse flow of electric current is controlled with a semiconductor device shown in FIG. 1, if a power source is coupled reversely, there is the possibility that a large reverse current flows in an H-bridge circuit through a parasitic diode of a MOS transistor. A technology of protecting a semiconductor device against such a situation is desired. Other problems and novel features will appear from the description and attached drawings in the specification.

A semiconductor device has a control section and an H-bridge circuit. The H-bridge circuit includes a first arm and a second arm; and supplies input current supplied from a power source to a motor 108 as a reversible electric current on the basis of a control signal outputted from the control section. The first arm is formed over a first island and the second arm is formed over a second island. A reverse-connection-time backflow prevention circuit to prevent electric current flowing in a direction opposite to the direction of an input current from being supplied to the H-bridge circuit is formed over an island identical to the control section.

Since a reverse-connection-time backflow prevention circuit is formed over an island identical to a control section to control an H-bridge circuit, it is possible to materialize a configuration of protecting a semiconductor device to control the forward or reverse flow of electric current against reverse connection of a power source by a simple structure.

DETAILED DESCRIPTION

Figure 1:
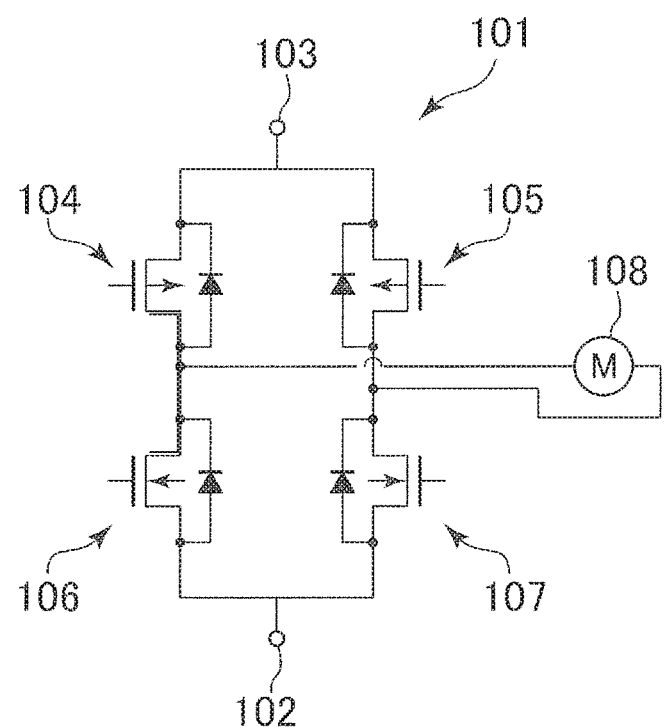
FIG. 1 is a circuit diagram of an H-bridge.
Figure 2:
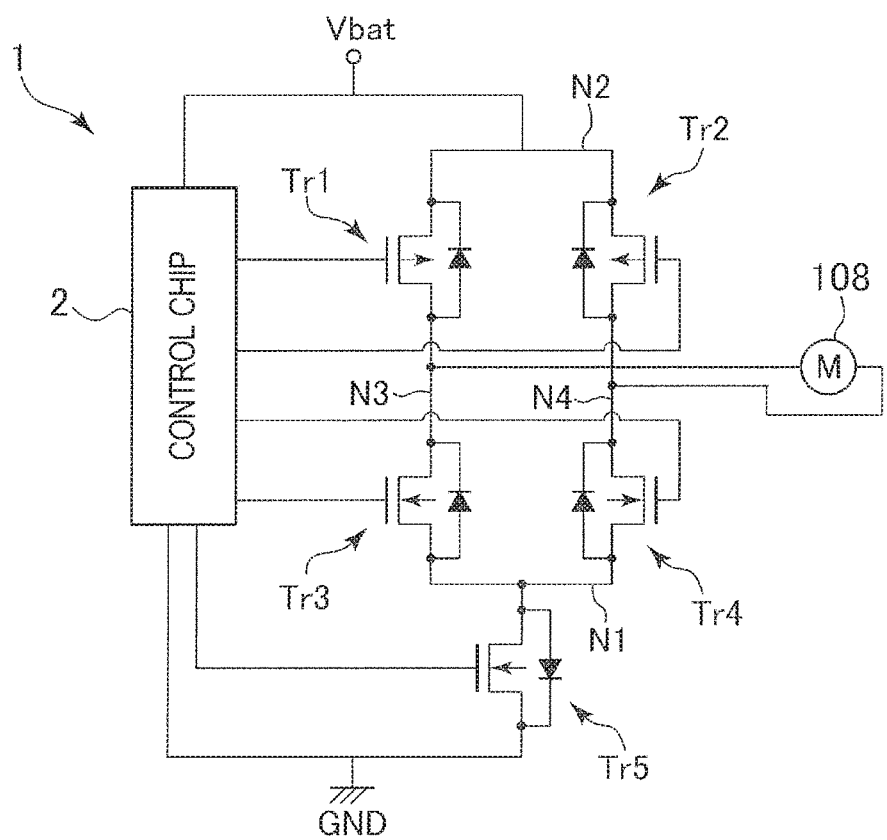
FIG. 2 is a circuit diagram of a semiconductor device according to a first embodiment.

Some embodiments are hereunder explained in reference to the attached drawings. FIG. 2 shows a semiconductor device 1 according to a first embodiment. The semiconductor device 1 has: a control chip 2 having a semiconductor circuit for control; and an H-bridge circuit controlled with the control chip 2. The H-bridge circuit supplies an input current supplied from a power source having a supply terminal Vbat and an earth terminal GND to a motor 108 as a reversible electric current. The H-bridge circuit has MOS (or MIS) transistors Tr1 to Tr4. Each of Tr1 to Tr4 is a power MOSFET used for the application of power electronics such as the drive current of the motor 108 and a vertical MOSFET having a low on-resistance is used frequently.

A first arm is formed by coupling a drain of a PMOS transistor Tr1 of a high side to a drain of an NMOS transistor Tr3 of a low side at a node N3. A second arm is formed by coupling a drain of a PMOS transistor Tr2 of the high side to a drain of an NMOS transistor Tr4 of the low side at a node N4. A source of Tr1 and a source of Tr2 are coupled to the supply terminal at a node N2. A source of Tr3 and a source of Tr4 are coupled to a node N1. As a result, the first arm and the second arm are parallelly-coupled and the H-bridge is formed. The node N3 at the middle point of the first arm and the node N4 at the middle point of the second arm have output terminals respectively and are coupled to the terminals of both electrodes of the motor 108.

The H-bridge is coupled to a source of a MOS (or MIS) transistor Tr5 of an N-channel for reverse-connection-time backflow prevention at the node N1. A drain of Tr5 is coupled to the earth terminal GND. Tr5 is also a vertical MOSFET having a low on-resistance. In a parasitic diode of Tr5, an anode is coupled to the side of a high potential and a cathode is coupled to the side of an earth electrode. Consequently, if a battery is coupled reversely when Tr5 is turned off, the parasitic diode of Tr5 is coupled reversely and the supply of electric current to the semiconductor device 1 is inhibited.

Figure 3:
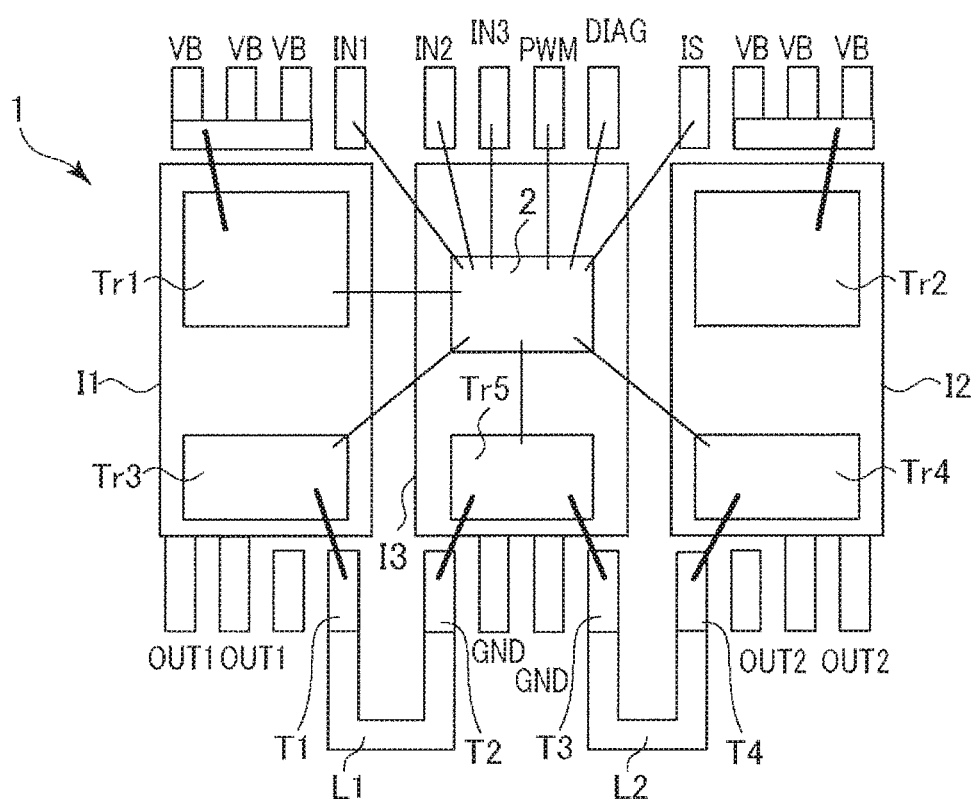
FIG. 3 shows a layout of a semiconductor device according to the first embodiment.

FIG. 3 shows a layout of the semiconductor device 1. The thin lines connecting between elements and terminals represent signal wires and the thick lines represent electric current wires through which a relatively large electric current flows in power electronics for driving a motor and the like. The semiconductor device 1 has three islands I1 to I3. The first arm, namely the MOS transistors Tr1 and Tr3 having the drains coupled in common, is formed over the first island I1. The second arm, namely the MOS transistors Tr2 and Tr4 having the drains coupled in common, is formed over the second island I2. The third island I3 is allocated between the island I1 and the island I2 and the control chip 2 and the MOS transistor Tr5 for reverse-connection-time backflow prevention are formed thereover.

Over the first island I1, the source of Tr1 is coupled to the supply terminal VB of the semiconductor device 1 through an electric current wire (thick line) and acts as the node N2 in FIG. 2. The drain of Tr1 and the drain of Tr3 are coupled in common to a substrate of the island I1 and act as the node N3. The semiconductor device 1 has a plurality of terminals formed over a lead frame and the source of Tr3 is coupled to a terminal T1 of the semiconductor device 1 through an electric current wire.

Over the second island I2, the source of Tr2 is coupled to the supply terminal VB of the semiconductor device 1 through an electric current wire (thick line) and acts as the node N2 in FIG. 2. The drain of Tr2 and the drain of Tr4 are coupled in common to the substrate of the island I1 and act as the node N4. The source of Tr4 is coupled to a terminal T4 of the semiconductor device 1 through an electric current wire.

The source of the MOS transistor Tr5 over the third island I3 is coupled to a terminal T2 and a terminal T3 of the semiconductor device 1 through electric current wires. When the semiconductor device 1 having such a configuration is mounted over a wiring substrate or the like, the terminal T1 is coupled to the terminal T2 and the terminal T3 is coupled to the terminal T4 through wires L1 and L2 outside the semiconductor device 1. As a result, the sources of Tr3, Tr4, and Tr5 are coupled in common at the node N1.

In other words, when the first terminal T1 is electrically coupled to the second terminal T2 through the external wire L1, the first arm over the first island I1 is coupled between both the electrodes Vbat and GND of a power source through Tr5 forming a reverse-connection-time backflow prevention circuit. When the third terminal T3 is electrically coupled to the fourth terminal T4 through the external wire L2, the second arm over the second island I2 is coupled between both the electrodes Vbat and GND of the power source through Tr5 forming the reverse-connection-time backflow prevention circuit.

Figure 4:
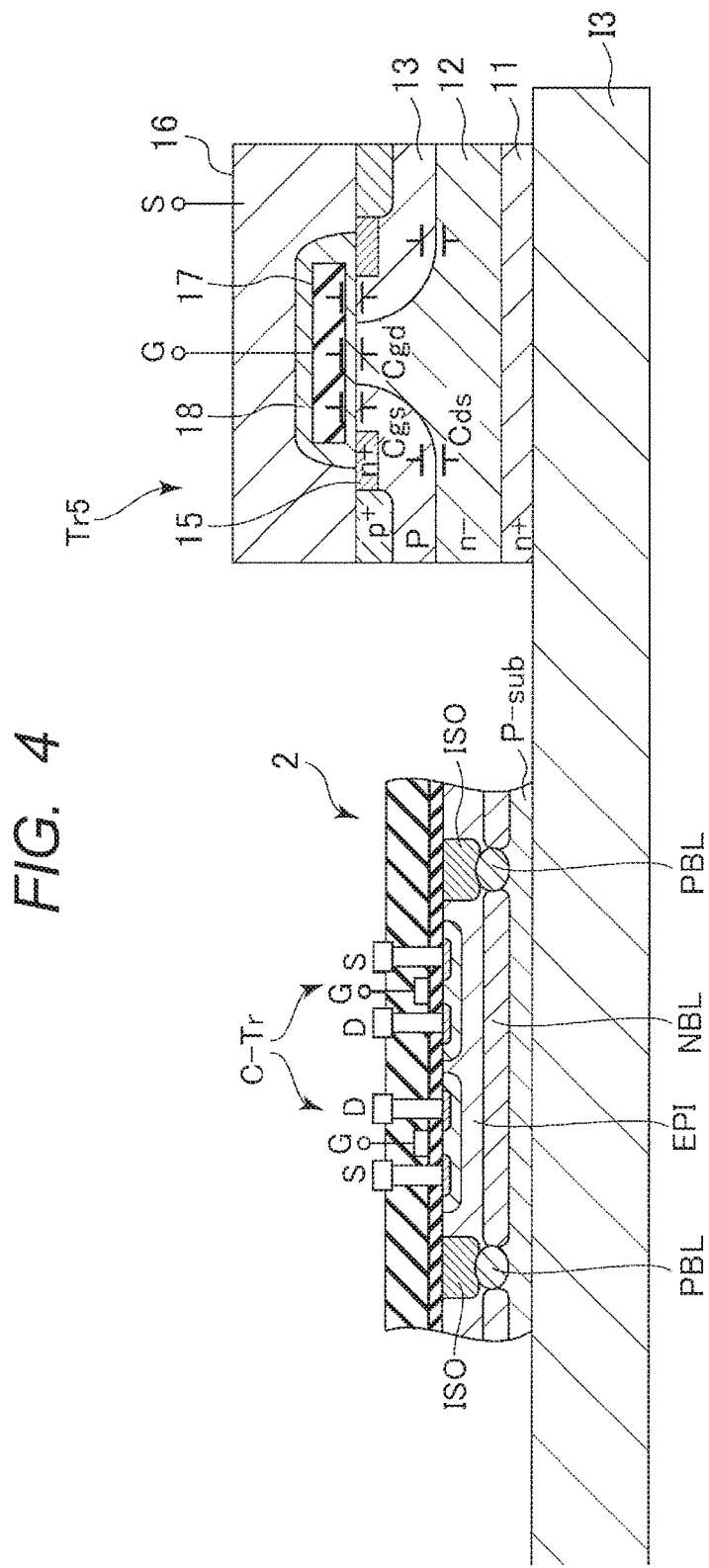
FIG. 4 is a sectional view of a second island over which a control chip and a reverse-connection-time backflow prevention circuit are mounted.

FIG. 4 is a schematic sectional view of a third island I3. A control chip 2 and a vertical N-channel MOS transistor Tr5 for preventing reverse current are formed over the third island I3. Various types are considered as a concrete configuration of Tr5 but, in the example of FIG. 4, an n$^+$ layer 11 is formed over an island I3, an n$^-$ layer 12 is formed over the n$^+$ layer 11, and a p well 13 and an n$^+$ well 15 are formed through a diffusion process applied to the n$^-$ layer 12. After those layers are formed, a gate oxide film 18, a gate electrode 17, and a source electrode 16 are formed. The n$^+$ layer 11 functions as a drain electrode. A channel formed in the n$^-$ layer 12 is controlled in response to a voltage applied to the gate electrode 17. In response to the channel control, electric current of a controlled quantity flows through the route ranging from the n$^+$ layer 11 on the drain side to the source electrode 16 via the n$^-$ layer 12, the p well 13, and the n$^+$ well 15. By forming many such vertical MOS transistors in the island I3, it is possible to materialize a reverse-connection-time backflow prevention circuit that: allows a relatively large electric current to flow in a forward direction and a reverse direction with a small on-resistance when a channel is formed; and prevents electric current in a reverse direction when a channel is not formed.

The control chip 2 includes a semiconductor circuit having a semiconductor element C-Tr for controlling such as a bipolar transistor, an N-channel MOS transistor, a P-channel MOS transistor, a CMOS circuit, or a DMOS (Double diffusion MOS). Each of those elements generally has a horizontal MOS or MIS structure in which terminals of a gate, a source, a drain, and the like are formed on the element surface side. The rear side thereof, namely the side of the island I3, is earthed. In FIG. 3, the island I3 is coupled to the earth terminal GND of the semiconductor device 1.

Figure 5:
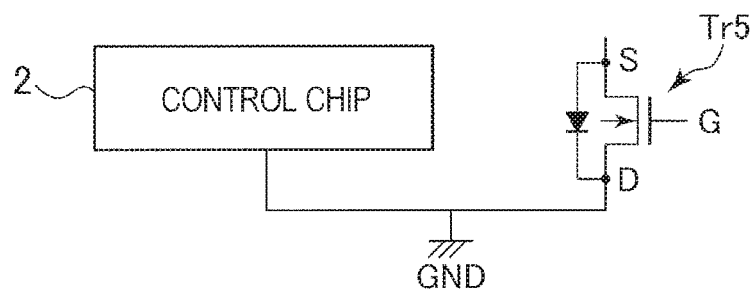
FIG. 5 shows relationship between a control chip and a reverse-connection-time backflow prevention circuit.

As shown in FIG. 2, the drain of the MOS transistor Tr5 is coupled to the earth electrode. Since Tr5 is a vertical NMOS transistor, the rear side (substrate side) acts as a drain. Consequently, as shown in FIG. 5, use of a third island I3 as an earth electrode can form a control chip 2 and a MOS transistor Tr5 for reverse-connection-time backflow prevention over the island I3 in common.

That is, in an H-bridge circuit for forward reverse control, it is possible to materialize a semiconductor device incorporating reverse-connection-time backflow prevention function by forming a MOS transistor Tr5 for reverse-connection-time backflow prevention over an island I3 over which a control chip 2 is also formed. Since it is unnecessary to prepare an island dedicated to a reverse-connection-time backflow prevention circuit, it is possible to obtain reverse-connection-time backflow prevention function by a simple configuration.

In the present embodiment further, since wires L1 and L2 are formed outside a semiconductor device 1, it is unnecessary to prepare a route for a relatively large electric current used for driving a motor or the like among islands I1 to I3. Consequently, it is possible to materialize a protection circuit without applying thick wire bonding between islands that seldom prevails technologically.

The semiconductor device 1 having such a configuration operates as follows. Firstly the semiconductor device 1 is mounted over a wiring substrate or the like. At the moment, the terminal T1 is coupled to the terminal T2 through the wire L1 and the terminal T3 is coupled to the terminal T4 through the wire L2. When a battery to supply a relatively large electric current for mechatronics such as driving the motor 108 is not coupled to the semiconductor device 1, the MOS transistor Tr5 keeps the state of being turned off.

When a battery is coupled, the control chip 2 detects the polarity of the battery by a preliminarily-arranged detection means. When the polarity of the battery is detected as normal, the control chip 2 makes the voltage drop caused by the reverse-connection-time backflow prevention circuit in a low state by turning on the MOS transistor Tr5. Subsequently, the H-bridge circuit operates ordinarily by a signal from the control chip 2 and the motor 108 (may also be another mechatronics component) rotates forward or backward.

When the motor 108 rotates forward, the control chip 2 turns off Tr2 and Tr3 and turns on Tr1 and Tr4 (driven by PWM or the like). As a result, an input current supplied from the supply terminal VB to the source of Tr1 is outputted from the drain of Tr1 to the output terminal (the middle point terminal of the first arm) of the first island I1. The output current is supplied to a terminal of the motor 108. The other terminal of the motor 108 is coupled to the input terminal (the middle point terminal of the second arm) of the third island I3. The input current is inputted from the drain of Tr4, outputted to the source, and further outputted to the wire L2. The output current of the wire L2 is inputted into the source of Tr5, outputted to the drain, and outputted to the earth terminal GND of the third island I3. When the motor 108 rotates backward, the control chip 2 turns off Tr1 and Tr4, turns on Tr2 and Tr3, and operates in the same manner as the case of forward rotation.

When plus and minus (Vbat and GND) of the battery are coupled inversely, the MOS transistor Tr5 is turned off and hence reverse current is prevented at Tr5. As a result, it is possible to protect the semiconductor device 1 when the battery is connected inversely.

Figure 6:
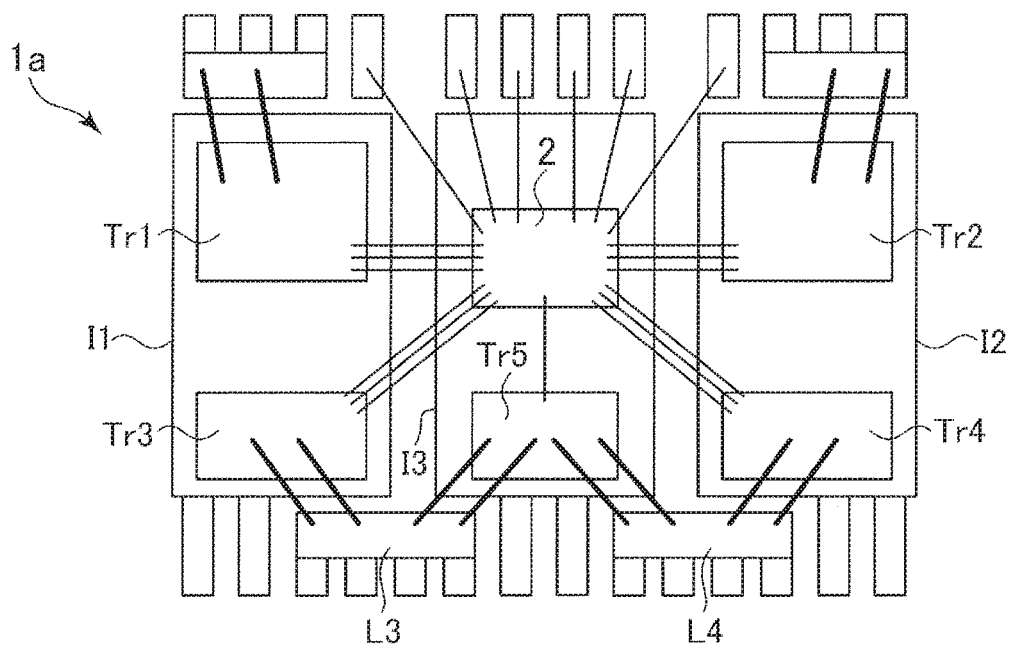
FIG. 6 shows a layout of a semiconductor device according to a second embodiment.

FIG. 6 is a plan view showing a layout of a semiconductor device 1a according to Second Embodiment. A coupling method of a node N1 is particularly different from First Embodiment. In the present embodiment, common connection of sources of Tr3, Tr4, and Tr5 at the node N1 is materialized with wires of a lead frame. Specifically, a source of a MOS transistor Tr3 over a first island I1 is coupled to a source of a MOS transistor Tr5 over a third island I3 through a wire L3 formed as a part of the lead frame. Further, a source of a MOS transistor Tr4 over a second island I2 is coupled to the source of the MOS transistor Tr5 over the third island I3 through a wire L4 formed as another part of the lead frame. That is, lead frame terminals form a route of an input current between a reverse-connection-time backflow prevention circuit and an H-bridge circuit.

In the present embodiment, a lead frame is shared by a plurality of islands I1 to I3 and electric current wires are coupled through the lead frame without the segmentation of the lead frame. In comparison with First Embodiment, since the wires L3 and L4 for preventing backflow in the event of reverse connection are installed inside the semiconductor device 1a, it is unnecessary to prepare a wire dedicated to a reverse-connection-time backflow prevention circuit on the side of a mounting board.

Figure 7:
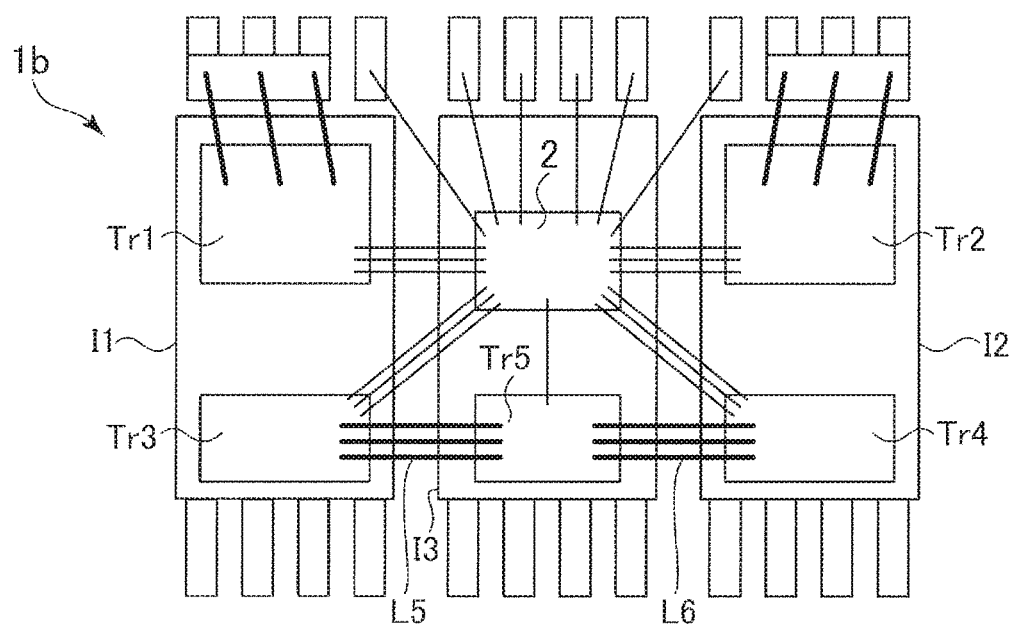
FIG. 7 shows a layout of a semiconductor device according to a third embodiment.

FIG. 7 is a plan view showing a layout of a semiconductor device 1b according to Third Embodiment. In the present embodiment too, a coupling method of a node N1 is particularly different from First Embodiment. In the present embodiment, a wire L5 that is an electric current wire between Tr3 and Tr5 is materialized with thick bonding wires between islands. A wire L6 that is an electric current wire between Tr4 and Tr5 is also materialized with thick bonding wires between islands. That is, the bonding wires form a route of an input current between a reverse-connection-time backflow prevention circuit and an H-bridge circuit. If a technology of a thick bonding wire for a large electric current advances, it is expected that such effects as obtained in the present embodiment improve.

Although the invention established by the present inventors has heretofore been explained concretely on the basis of the embodiments, it goes without saying that the present invention is not limited to the embodiments and can be variously modified in the range not deviating from the tenor of the present invention. For example, it is possible to incorporate the embodiments according to the present invention in an uncontradictory range.

What is claimed is:

1. A semiconductor device including an H-Bridge driver, the H-Bridge driver comprising:
    a first island on which a first power transistor and a second power transistor are mounted;
    a second island on which a third power transistor and a fourth power transistor are mounted;
    a third island on which a control circuit and a protection power transistor are mounted, the control circuit being configured to control the first, second, third and fourth power transistors,
    wherein the third island is allocated between the first island and the second island.

2. A semiconductor device according to claim 1, further comprising a plurality of terminals formed over a lead frame,
    wherein the second power transistor and the fourth power transistor are coupled to the protection power transistor via the lead frame.

3. A semiconductor device according to claim 2,
    wherein the second power transistor and the fourth power transistor are coupled to the protection power transistor via an external wiring disposed outside the semiconductor device.

* * * * *